US008330506B2

(12) United States Patent
Trotta et al.

(10) Patent No.: US 8,330,506 B2
(45) Date of Patent: Dec. 11, 2012

(54) FREQUENCY MULTIPLIER CIRCUIT

(75) Inventors: Saverio Trotta, Munich (DE); Bernhard Dehlink, Unterhaching (DE)

(73) Assignee: Freescale Semiconductor, Inc., Austin, TX (US)

( * ) Notice: Subject to any disclaimer, the term of this patent is extended or adjusted under 35 U.S.C. 154(b) by 13 days.

(21) Appl. No.: 13/126,191

(22) PCT Filed: Nov. 24, 2008

(86) PCT No.: PCT/IB2008/054919
§ 371 (c)(1),
(2), (4) Date: Apr. 27, 2011

(87) PCT Pub. No.: WO2010/058247
PCT Pub. Date: May 27, 2010

(65) Prior Publication Data
US 2011/0215844 A1  Sep. 8, 2011

(51) Int. Cl.
*H03B 19/00* (2006.01)
(52) U.S. Cl. .......................... 327/122; 327/119
(58) Field of Classification Search .................. 327/113, 327/114, 116, 119–123
See application file for complete search history.

(56) References Cited

U.S. PATENT DOCUMENTS 3,419,787 A * 12/1968 Baehre .......................... 363/127
7,019,565 B2 * 3/2006 Tam et al. ...................... 327/122
7,227,392 B2 * 6/2007 Yamamoto .................... 327/122

FOREIGN PATENT DOCUMENTS
JP  56168413 A  12/1981

OTHER PUBLICATIONS

Chung A et al: "Precision Bipolar 5-6 GHZ Band Quadrature Phase Generator" Proceedings of the 2003 Bipolar/BICMOS Circuits and Technology Meeting, Toulouse, France, Sep. 28-30, New York, NY, IEEE, US, Sep. 28, 2003, pp. 185-188.
Gruson Frank et al: "A Frequency Doubler with High Conversion Gain and Good Fundamental Suppression" IEEE, MTT-S Digest, TU2C-3, 2004, pp. 175-178.
International Search Report and Written Opinion correlating to PCT/IB2008/054919 dated Apr. 3, 2009.

* cited by examiner

*Primary Examiner* — Patrick O'Neill

(57) ABSTRACT

A frequency multiplier circuit, comprising a first stage including a first differential pair of amplifier elements having respective current conduction paths connected in parallel between first and second nodes and respective control terminals connected to receive input signals of opposite polarity at an input frequency in the radio frequency range, the first and second nodes being connected to respective bias voltage supply terminals through first and second impedances respectively so that current flowing differentially in the current conduction paths of the first differential pair of amplifier elements produces a voltage difference across the first and second nodes at a frequency which contains a harmonic of the input frequency, and a second stage including a second differential pair of amplifier elements coupled at the harmonic of the input frequency with the first and second nodes to amplify differentially the voltage difference and produce an output signal at the harmonic of the input frequency. Radio frequency connections apply the voltage difference across the first and second nodes at the frequency of the harmonic to the second differential pair of amplifier elements and block direct current, and separate direct current connections connect respectively the first differential pair of amplifier elements and the second differential pair of amplifier elements across the bias voltage supply terminals.

20 Claims, 2 Drawing Sheets

FREQUENCY MULTIPLIER CIRCUIT

FIELD OF THE INVENTION

This invention relates to a frequency multiplier circuit.

BACKGROUND OF THE INVENTION

Frequency multiplier circuits are widely employed in radio frequency ('RF') communication and sensor systems, for example. The expression 'radio frequency' is used in this specification to designate wireless communication frequencies without any specific upper limit and embodiments of this invention are usable up to millimetric wavelength frequencies and beyond.

A frequency multiplier circuit produces an output signal at a frequency which is a multiple of the frequency of an input signal applied to it. Typically, the output signal is a harmonic of the input signal, so that the output frequency is related to the input frequency by one or more factors of two. In the case of a frequency doubler circuit, the output signal is the harmonic whose frequency is double that of the input signal.

The article "A frequency doubler with high conversion gain and good fundamental suppression" by Gruson, F., Bergmann, G. and Schumacher, H. published in Microwave Symposium Digest, 2004 IEEE MTT-S International discloses a frequency doubler architecture applied to a K/sub u-/band frequency doubler which drives the local oscillator ('LO') port of a single-balanced Gilbert mixer.

SUMMARY OF THE INVENTION

The present invention provides a frequency multiplier circuit as described in the accompanying claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Figure 1:
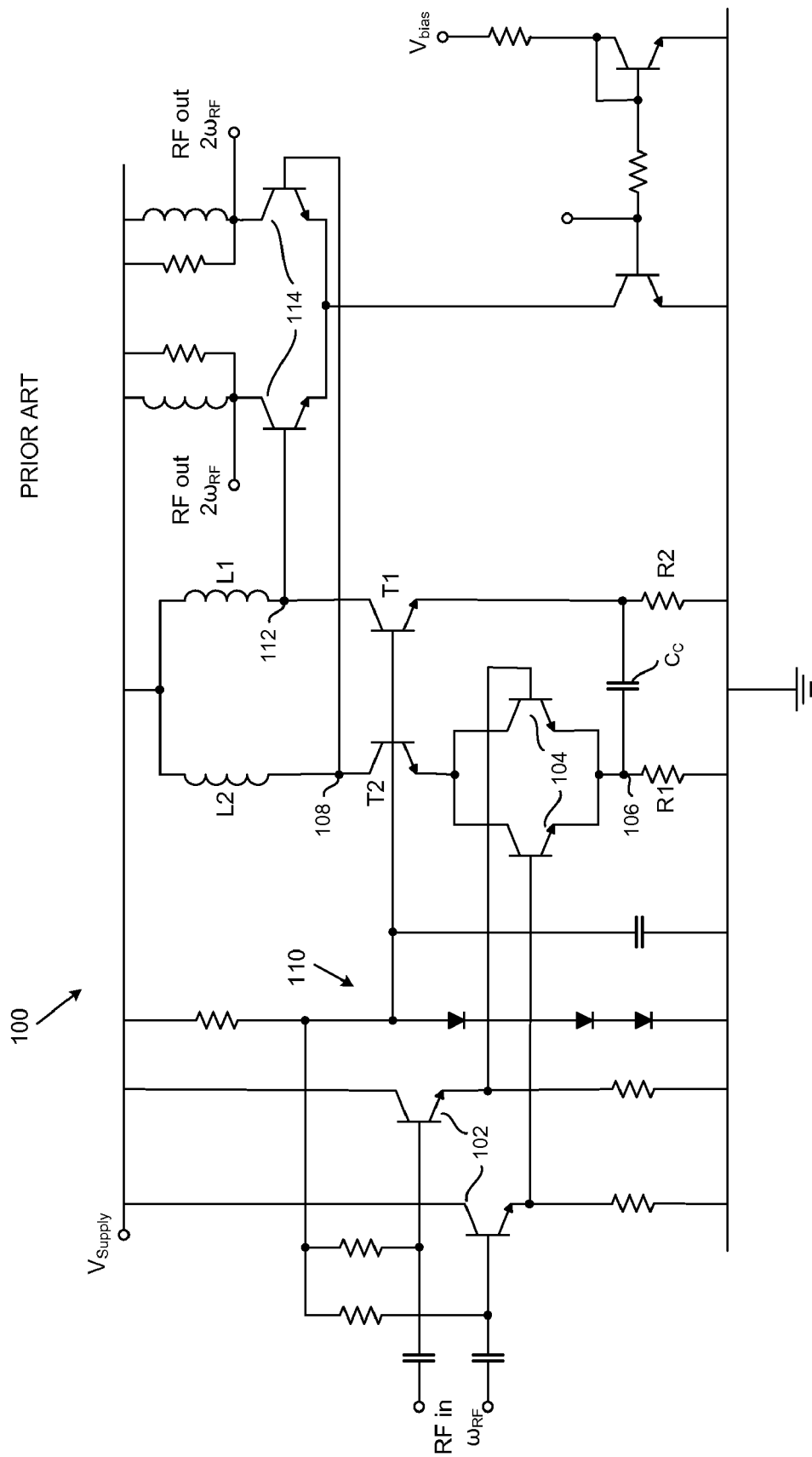
FIG. 1 is a circuit diagram of a known frequency doubler circuit.

FIG. 1 shows a frequency doubler circuit 100 described in the article "A frequency doubler with high conversion gain and good fundamental suppression" by Gruson, F., Bergmann, G. and Schumacher, H. published in Microwave Symposium Digest, 2004 IEEE MTT-S International. The frequency doubler circuit 100 comprises an input pair of emitter follower bipolar transistors 102, whose emitters are connected to respective bases of a common emitter pair of transistors 104, whose emitters 106 are connected together, and are connected to ground through a resistor R1. A coupling capacitor $C_C$ is connected between the common emitters 106 of the transistor pair 104 and an emitter of a transistor T1, which is connected to ground through a resistor R2. The collectors 108 of the transistor pair 104 are connected together and to an emitter of a transistor T2. The transistors T1 and T2 are connected in common base configuration, the bases of the transistors T1 and T2 being connected together and to a direct current ('DC') bias source 110, and hence to ground for RF signals. The collectors of the transistors T1 and T2 are connected through respective inductances L1 and L2 to a DC voltage supply rail. The RF voltage at the collector 112 of the transistor T1 follows the voltage at the emitters 106 of the transistor pair 104. The outputs of the frequency doubler circuit 100 are taken from the collectors 112, 108 of the transistors T1, T2 through a differential buffer amplifier 114 and follow the RF voltage difference between the emitters 106 of the transistor pair 104 and the collector 108 of the transistor T2.

The frequency doubler circuit 100 exploits the fact that the RF voltage at the common emitters 106 of the transistor pair 104 varies under large signal excitation as a harmonic of the input frequency, notably the harmonic at a frequency $2\omega_{RF}$ which is twice the input frequency, since the transistors of the pair 106 conduct alternately in successive half-cycles of the input signal. The transistor T2 is stacked with its emitter-collector current conduction path in series with the common emitter pair 104, which requires a DC supply voltage $V_{Supply}$ higher than if they had separate collector-emitter DC voltage supplies. The bases of the transistors T1 and T2 are biased at a 2.2 V reference voltage and a higher value of the supply voltage $V_{Supply}$ is needed. Different loads are presented to the emitters of the transistors T1 and T2: the resistors R1 and R2 have different values, R1=100Ω and R2=270Ω in the circuit 100 described, and the voltage drop across R1 is 1×Vbe while that across R2 is 2×Vbe so that the transistors T1 and T2 are unbalanced and may suffer instability. A balanced input signal with low amplitude difference and low phase error is needed in order to achieve high fundamental input frequency suppression at the output. Since the transistors T1 and T2 not connected in a fully balanced, differential configuration, the characteristics of the circuit 100 are liable to be temperature dependent.

Figure 2:
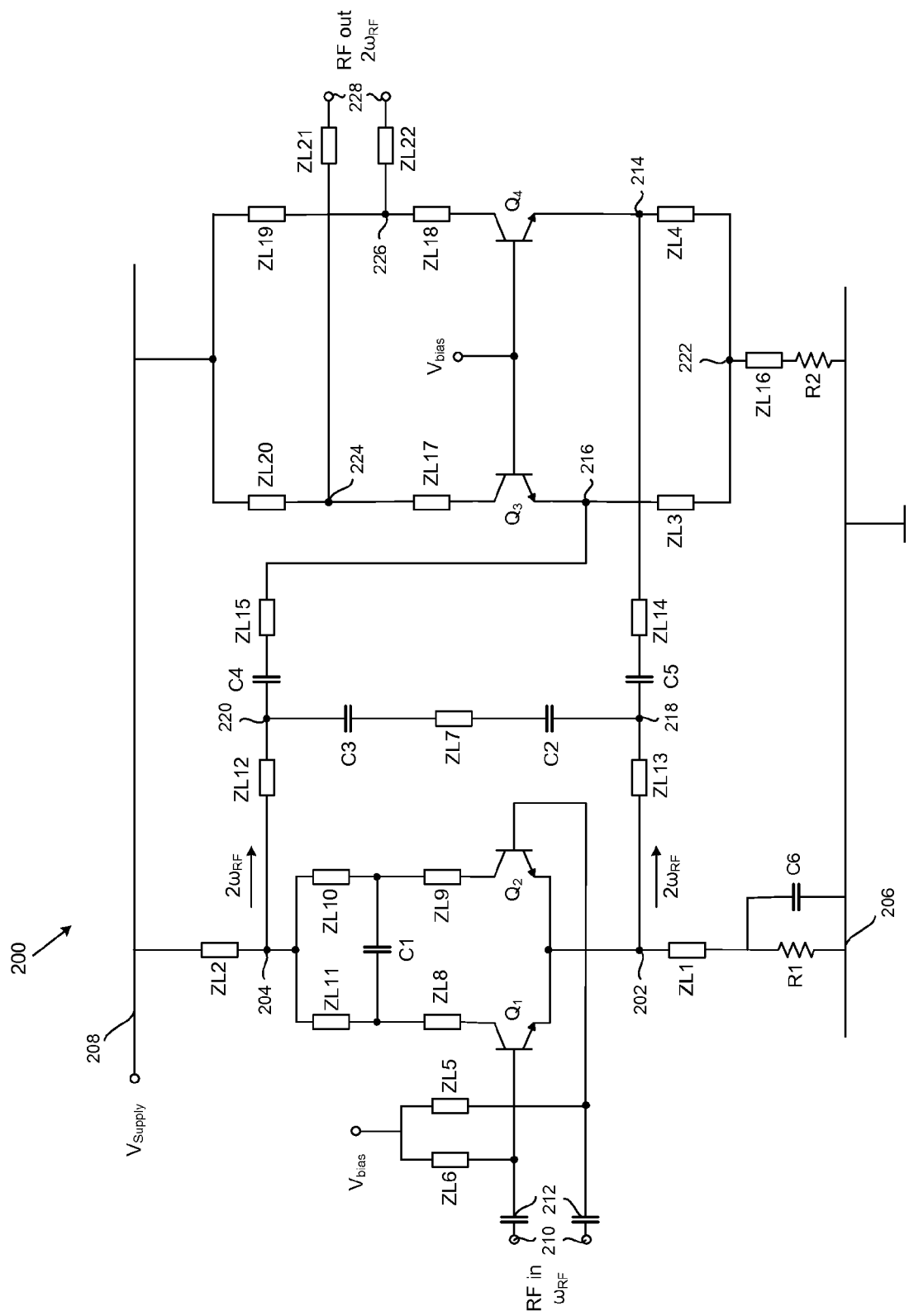
FIG. 2 is a circuit diagram of a frequency doubler circuit in accordance with one embodiment of the invention, given by way of example.

FIG. 2 shows an example of a frequency multiplier circuit 200 in accordance with an embodiment of the present invention. The frequency multiplier circuit 200 comprises a first stage including a first differential pair of amplifier elements $Q_1$, $Q_2$ having respective current conduction paths connected in parallel between first and second nodes 202, 204 and respective control terminals connected to receive input signals of opposite polarity at an input frequency $\omega_{RF}$ in the radio frequency range. The first and second nodes 202, 204 are connected to respective bias voltage supply terminals 206, 208 through first and second impedances ZL1, ZL2 respectively so that current flowing differentially in the current conduction paths of the first differential pair of amplifier elements $Q_1$, $Q_2$ produces a voltage difference across the first and second nodes 202, 204 at a frequency which contains a harmonic of the input frequency. A second stage includes a second differential pair of amplifier elements $Q_3$, $Q_4$ coupled at the harmonic of the input frequency with the first and second nodes 202, 204 to amplify differentially the voltage difference and produce an output signal at the harmonic of said input frequency. In this example, the harmonic is arranged to be the harmonic $2\omega_{RF}$ of the input frequency, so that the output signal is at double the input frequency, but it is possible to arrange for the output signal to be at a higher harmonic frequency. In this example, the input frequency is 38.5 GHz and the output frequency is 77 GHz.

In this example of the circuit 200, instead of the second stage being stacked in series with the first stage across the voltage supply rails as in FIG. 1, the circuit includes radio frequency connections for applying the voltage difference across the first and second nodes 202, 204 at the frequency of the harmonic to the second differential pair of amplifier elements $Q_3$, $Q_4$ and for blocking direct current, and separate direct current connections for connecting respectively the first differential pair of amplifier elements $Q_1$, $Q_2$ and the second differential pair of amplifier elements $Q_3$, $Q_4$ across the bias voltage supply terminals 206, 208.

In more detail, this example of the frequency multiplier circuit 200 comprises a pair of input terminals 210 to which the RF input signal is applied at an input frequency $\omega_{RF}$ in the radio frequency range. The terminals 210 are connected through a pair of DC blocking capacitors 212 to apply input signals with opposite polarity to the bases of bipolar transistors $Q_1$, $Q_2$, forming the first differential pair of amplifier elements. The bases of the transistors $Q_1$, $Q_2$ are connected through a pair of RF blocking elements ZL5 and ZL6 to a DC source of bias voltage $V_{bias}$, the RF blocking elements ZL5 and ZL6 being resistors or transmission lines of quarter wavelength at the input frequency $\omega_{RF}$. The emitters of the transistors $Q_1$, $Q_2$ are connected together at the node 202 and to the DC supply terminal 206, at ground potential, through an impedance element ZL1 and a resistor R1 in series. The emitter-collector current conduction paths of the transistors $Q_1$, $Q_2$ are connected in parallel between the first and second nodes 202, 204, the collector of the transistor $Q_1$ being connected to the node 204 through impedance elements ZL8 and ZL11 in series and the collector of the transistor $Q_2$ being connected to the node 204 through impedance elements ZL9 and ZL10 in series, and a capacitor C1 connects the mid-point between the impedance elements ZL8 and ZL11 with the mid-point between the impedance elements ZL9 and ZL10. The node 204 is connected to the DC supply terminal 208, at potential $V_{Supply}$, through an impedance element ZL2.

A network provides RF connections for applying the voltage difference across the first and second nodes 202, 204 at the frequency of the harmonic to the second differential pair of amplifier elements $Q_3$, $Q_4$. The RF connections couple the nodes 202 and 204 to nodes 214 and 216, which are connected to the emitters of transistors $Q_4$ and $Q_3$, forming the second differential pair of amplifier elements. The coupling network comprises an impedance element ZL13 connecting the node 202 to a node 218 and an impedance element ZL12 connecting the node 204 to a node 220. A capacitor C2 is connected to the node 218, a capacitor C3 is connected to the node 220 and an impedance element ZL7 is connected to the capacitors C2 and C3 so that the impedance element ZL7 and the capacitors C2 and C3 are connected in series across the nodes 202 and 204 through the impedance elements ZL13 and ZL12. The nodes 218 and 220 are connected to the nodes 214 and 216 through DC blocking capacitors C5 and C4 in series with impedance elements ZL14 and ZL15 respectively, so that the RF connections between the nodes 202 and 204 and the nodes 214 and 216 do not form DC connections.

The nodes 214 and 216 are connected through respective impedance elements ZL4 and ZL3 to a node 222, which is connected through an impedance element ZL16 and a resistor R2 to the ground supply terminal 206. The bases of the transistors $Q_3$ and $Q_4$ are connected together and to a source of bias voltage $V_{bias}$. The collectors of the transistors $Q_3$ and $Q_4$ are connected through respective impedance elements ZL17 and ZL18 to nodes 224 and 226, which are connected to the supply terminal at potential $V_{Supply}$. Accordingly, the DC connections for the second differential pair of amplifier elements $Q_3$, $Q_4$ across the bias voltage supply terminals 206, 208 are separate from the DC connections for the first differential pair of amplifier elements $Q_1$, $Q_2$, the respective DC connections across the bias voltage supply terminals 206, 208 being in parallel. The nodes 224 and 226 are connected to a pair 228 of output terminals through respective impedance elements ZL21 and ZL22.

In this example of implementation of the invention, the impedance elements ZL1 to ZL22 are all transmission line elements of suitable length, although other impedance elements can be used. The transmission line elements ZL1, ZL2, ZL3 and ZL4 are all quarter wavelength at the harmonic frequency, $2\omega_{RF}$ in this example, and block signals at the harmonic frequency. The transmission line elements ZL8, ZL9, ZL10 and ZL11 and the capacitor C1 are tuned to produce selectively at the node 204, with high efficiency, a signal at the harmonic frequency, $2\omega_{RF}$ in this example. The transmission line element ZL7 is a half wavelength at the harmonic frequency, $2\omega_{RF}$ in this example and the transmission line elements ZL12 and ZL13 and the capacitors C2 and C3 are tuned to produce selectively across the nodes 218 and 220 a signal at the harmonic frequency, $2\omega_{RF}$ in this example, which is a balanced differential signal.

The transmission lines ZL14 and ZL15 are RF interconnection lines, which connect the emitter-collector current conduction paths of the transistors $Q_3$, $Q_4$ of the second differential pair in series with the emitter-collector current conduction paths of the transistor elements $Q_1$, $Q_2$ of the first stage at the harmonic frequency, $2\omega_{RF}$ in this example, the series capacitors C4 and C5 passing the RF signal at the harmonic frequency. However, the series capacitors C4 and C5 block the DC bias voltages, so that the DC supplies for the emitter-collector current conduction paths of the transistors $Q_3$, $Q_4$ of the second differential pair are separate from and in parallel with the emitter-collector current conduction paths of the transistor elements $Q_1$, $Q_2$ of the first stage and the bias voltages of the two stages can be set separately. Notably, there is no stacking of the transistors in series, so that the DC supply voltage and current consumption can be reduced below that needed for the stacked configuration of FIG. 1.

The fully differential coupling and functionality of the first and second stages ensures balanced operation. Very low levels of signal feed through from the input to the output at the input fundamental frequency are obtained. The conversion efficiency of the input signal to the frequency multiplied output signal is high.

The common-mode stability in the common base stage is improved by the resistive load R2, of 30Ω in one implementation, common to the emitter currents of the transistors $Q_3$ and $Q_4$, in parallel to the output impedance of the doubler. The configuration of FIG. 2 gives good mismatch rejection.

The value of the capacitor C6 is chosen as a function of the harmonic frequency, $2\omega_{RF}$ in this example, and of the tail current of the transistors $Q_1$ and $Q_2$ to obtain a peak in the voltage transfer of the transistors $Q_1$ and $Q_2$ at the desired harmonic frequency.

The embodiment of the invention shown in FIG. 2 utilises bipolar transistors. However, it will be appreciated that the circuit can be adapted to utilise other amplifier elements, such as field-effect transistors, for example.

In another example of an embodiment of the invention, instead of the second differential pair of amplifier elements $Q_3$, $Q_4$ having control terminals connected together and in common base or common gate configuration, the second differential pair of amplifier elements $Q_3$, $Q_4$ are connected in common emitter or common source configuration.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

Where the context admits, it will be understood that the semiconductor devices described herein can be made of any suitable semiconductor material or combinations of materials, such as gallium arsenide, silicon germanium, silicon-on-insulator (SOI), silicon, mono-crystalline silicon, the like, and combinations of the above.

Where the apparatus implementing the present invention is composed of electronic components and circuits known to those skilled in the art, circuit details have not been explained to any greater extent than that considered necessary for the understanding and appreciation of the underlying concepts of the present invention.

Where the context admits, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Where the context admits, illustrated hardware elements may be circuitry located on a single integrated circuit or within a same device or may include a plurality of separate integrated circuits or separate devices interconnected with each other. Also, hardware elements in an embodiment of the invention may be replaced by software or code representations in an embodiment of the invention.

Furthermore, it will be appreciated that boundaries described and shown between the functionality of circuit elements and/or operations in an embodiment of the invention are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

In the claims, any reference signs placed between parentheses shall not be construed as limiting the claim. Where the context admits, terms such as "first" and "second" are used to distinguish arbitrarily between the elements such terms describe and these terms are not necessarily intended to indicate temporal order or prioritization of such elements.

The invention claimed is:

1. A frequency multiplier circuit, comprising:
a first stage including a first differential pair of amplifier elements having respective current conduction paths connected in parallel between first and second nodes and respective control terminals connected to receive input signals of opposite polarity at an input frequency in the radio frequency range, said first and second nodes being connected to respective bias voltage supply terminals through first and second impedances respectively so that current flowing differentially in said current conduction paths of said first differential pair of amplifier elements produces a voltage difference across said first and second nodes at a frequency which contains a harmonic of said input frequency;

a second stage including a second differential pair of amplifier elements;
radio frequency connections for applying said voltage difference across said first and second nodes at the frequency of said harmonic to said second differential pair of amplifier elements to amplify differentially said voltage difference and produce an output signal at said harmonic of said input frequency, said radio frequency connections blocking direct current; and
direct current connections for connecting said second differential pair of amplifier elements across said bias voltage supply terminals separately from, and in parallel with, direct current connections for said first differential pair of amplifier elements.

2. A frequency multiplier circuit as claimed in claim 1, wherein said direct current connections for said second differential pair of amplifier elements connect said current conduction paths of said second differential pair of amplifier elements to one of said bias voltage supply terminals through respective impedances which present higher impedances to said harmonic of said input frequency than to bias voltage.

3. A frequency multiplier circuit as claimed in claim 2, wherein said amplifier elements of said second stage comprise respective transistor elements having control terminals connected together and in common base or common gate configuration.

4. A frequency multiplier circuit as claimed in claim 2, wherein said radio frequency connections couple said second differential pair of amplifier elements at said harmonic of said input frequency with said first and second nodes in cascaded configuration with said first differential pair of amplifier elements.

5. A frequency multiplier circuit as claimed in claim 2, wherein said first and second impedances present higher impedances to said harmonic of said input frequency than to bias voltage.

6. A frequency multiplier circuit as claimed in claim 2, and including a transmission line presenting a half wavelength at said harmonic of said input frequency and DC blocking elements connected in series across nodes in said radio frequency connections.

7. A frequency multiplier circuit as claimed in claim 1, wherein said amplifier elements of said second stage comprise respective transistor elements having control terminals connected together and in common base or common gate configuration.

8. A frequency multiplier circuit as claimed in claim 7, wherein said radio frequency connections couple said second differential pair of amplifier elements at said harmonic of said input frequency with said first and second nodes in cascaded configuration with said first differential pair of amplifier elements.

9. A frequency multiplier circuit as claimed in claim 7, wherein said first and second impedances present higher impedances to said harmonic of said input frequency than to bias voltage.

10. A frequency multiplier circuit as claimed in claim 7, and including a transmission line presenting a half wavelength at said harmonic of said input frequency and DC blocking elements connected in series across nodes in said radio frequency connections.

11. A frequency multiplier circuit as claimed in claim 1, wherein said radio frequency connections couple said second differential pair of amplifier elements at said harmonic of said input frequency with said first and second nodes in cascaded configuration with said first differential pair of amplifier elements.

12. A frequency multiplier circuit as claimed in claim 4, wherein said impedances comprise transmission lines presenting a quarter wavelength at said harmonic of said input frequency.

13. A frequency multiplier circuit as claimed in claim 11, wherein said first and second impedances present higher impedances to said harmonic of said input frequency than to bias voltage.

14. A frequency multiplier circuit as claimed in claim 11, and including a transmission line presenting a half wavelength at said harmonic of said input frequency and DC blocking elements connected in series across nodes in said radio frequency connections.

15. A frequency multiplier circuit as claimed in claim 1, wherein said first and second impedances present higher impedances to said harmonic of said input frequency than to bias voltage.

16. A frequency multiplier circuit as claimed in claim 15, wherein said impedances comprise transmission lines presenting a quarter wavelength at said harmonic of said input frequency.

17. A frequency multiplier circuit as claimed in claim 15, and including a transmission line presenting a half wavelength at said harmonic of said input frequency and DC blocking elements connected in series across nodes in said radio frequency connections.

18. A frequency multiplier circuit as claimed in claim 1, and including a transmission line presenting a half wavelength at said harmonic of said input frequency and DC blocking elements connected in series across nodes in said radio frequency connections.

19. A frequency multiplier circuit as claimed in claim 1, wherein said first differential pair of amplifier elements comprises respective transistor elements connected in common emitter or common source configuration.

20. A frequency multiplier circuit as claimed in claim 1, wherein said harmonic and said output signal are arranged to be double said input frequency.

* * * * *